United States Patent
Horng et al.

(10) Patent No.: US 6,706,421 B1
(45) Date of Patent: Mar. 16, 2004

(54) LOW RESISTANCE CONDUCTOR LEADS FOR GMR HEADS

(75) Inventors: Cheng T. Horng, San Jose, CA (US); Mao-Min Chen, San Jose, CA (US); Ru-Ying Tong, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/483,937

(22) Filed: Jan. 18, 2000

(51) Int. Cl.⁷ .............................. B32B 15/01
(52) U.S. Cl. ................... 428/670; 428/680; 360/113
(58) Field of Search ................ 428/670, 929, 428/680, 666, 938, 607; 360/137, 110, 113

(56) References Cited

U.S. PATENT DOCUMENTS

| | | | |
|---|---|---|---|
| 4,908,599 A | * 3/1990 | Breen et al. | 338/22 R |
| 5,268,806 A | 12/1993 | Goubau et al. | 360/113 |
| 5,491,600 A | 2/1996 | Chen et al. | 360/113 |
| 5,742,459 A | 4/1998 | Shen et al. | 360/113 |
| 5,883,764 A | 3/1999 | Pinarbasi | 360/113 |
| 5,929,441 A | * 7/1999 | Beratan et al. | 250/338.3 |

* cited by examiner

Primary Examiner—John J. Zimmerman
(74) Attorney, Agent, or Firm—George O. Saile; Stephen B. Ackerman

(57) ABSTRACT

A lead structure for use with a magneto-resistive sensing element in a magnetic disk system is described. The lead structure comprises a layer of ruthenium or rhodium sandwiched between layers of a nickel-chromium alloy. The lower nickel-chromium layer acts as a seed layer to ensure that the ruthenium and rhodium layers have crystal structures that correspond to low resistivity phases. The interfaces between these three layers introduce a minimum of interfacial scattering of the conduction electrons thereby keeping dimensional increases in resistivity to a minimum.

20 Claims, 1 Drawing Sheet

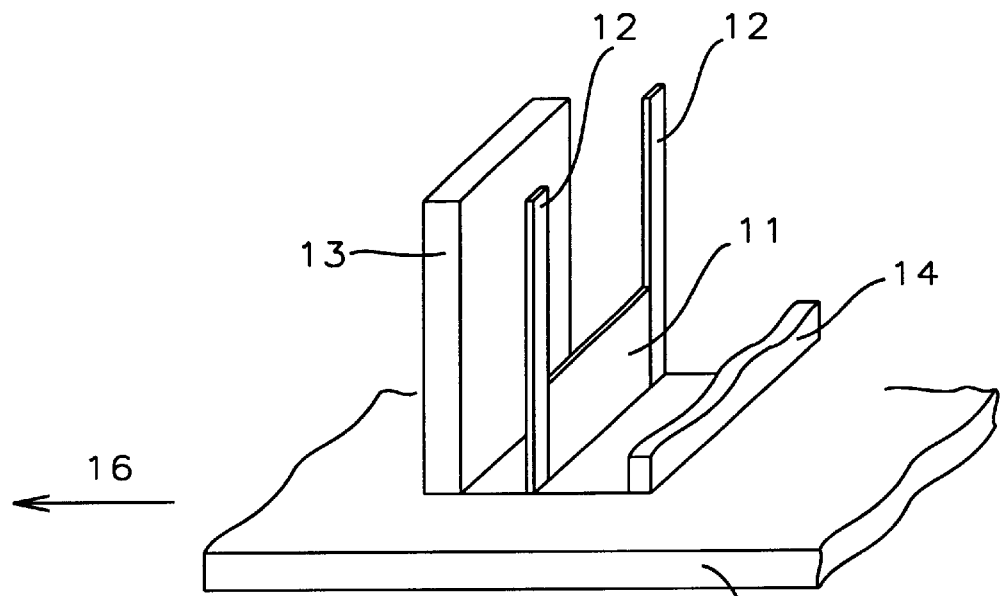
*FIG. 1 - Prior Art*
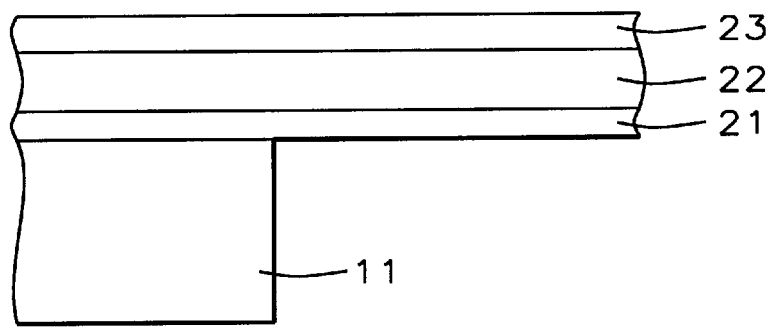
*FIG. 2*
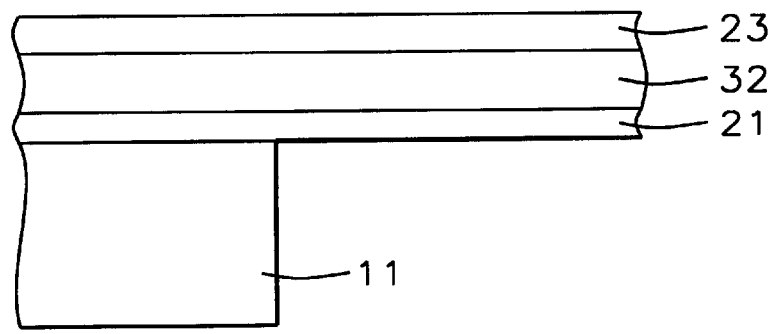
*FIG. 3*

LOW RESISTANCE CONDUCTOR LEADS FOR GMR HEADS

FIELD OF THE INVENTION

The invention relates to the general field of thin film microcircuits with particular reference to conductive leads for attachment to GMR (giant magneto-resistive) sensor elements.

BACKGROUND OF THE INVENTION

FIG. 1 is a schematic illustration of the read portion of a read-write head used in magnetic recording. The principal elements are a strip of magneto-resistive material 11, contact to which is made through leads 12. Sensor strip 11 is located between magnetic shields 13 and 14 (14 also serves as one of the pole pieces of the write head; it is shown as partly stripped away for purposes of clarification). The space between these various elements is filled with an insulating material, such as aluminum oxide (not shown).

Information, stored as stripes of magnetized material, is contained in storage layer 15 which moves below the sensor in a direction 16. The principle governing the operation of read sensor 11 is the change of resistivity of certain materials in the presence of a magnetic field (magneto-resistance). The magneto-resistance effect manifests itself as an increase in resistivity when the material is magnetized in a direction perpendicular to the easy axis, said increase being reduced to zero when magnetization is along the easy axis.

It is now known that the magneto-resistance effect can be significantly increased by means of a thin film structure known as a spin valve. The resulting increase (known as Giant magneto-resistance or GMR) derives from the fact that electrons in a magnetized solid are subject to significantly less scattering by the lattice when their own magnetization vectors (due to spin) are parallel (as opposed to anti-parallel) to the direction of magnetization of the solid as a whole.

At the present time, leads (such as 12 in the figure) are formed from laminates of tantalum/gold/tantalum. This combination has proven satisfactory as it is relatively low resistance (due to the gold) and has high corrosion resistance. It is, however, anticipated that newer GMR sensors such as HPD (High Performance Drive) and HDR(High Data Rate) will require leads that, in addition to possessing the above properties, are also harder and have a higher melting point. These additional properties are needed because of harsher environments (e.g. higher RPM) that these newer sensors will encounter.

A routine search of the prior art did not turn up any references that describe the exact structure of the present invention. The search did, however, uncover several references that were of interest. For example, U.S. Pat. No. 5,883,764(Pinarbasi) shows conductive leads comprised of Ta, Cr, and Ta. U.S. Pat. No. 5,268,806(Goubau et al.) shows a conductive lead comprised of Ta. U.S. Pat. No. 5,491,600 (Chen et al.) teaches a multi-layered lead comprised of Ta and Au while U.S. Pat. No. 5,742,459(Shen et al.) also discloses a multi-layered lead structure.

SUMMARY OF THE INVENTION

It has been an object of the present invention to provide a conductor lead for a magneto-resistive sensing element in a magnetic recording system.

Another object of the invention has been that said lead be compatible with HDP and HDR type GMR heads.

A further object of the invention has been that said lead have low sheet resistance, high corrosion resistance, high melting point, and a high hardness value.

These objects have been achieved by providing a lead structure comprising a layer of ruthenium or rhodium sandwiched between layers a nickel-chromium alloy. The lower nickel-chromium layer acts as a seed that ensures that the ruthenium and rhodium over-layers have crystal structures that have low resistivity. The interfaces between these three layers introduce a minimum of interfacial scattering of the conduction electrons keeping dimensional increases in resistivity to a minimum.

BRIEF DESCRIPTION OF THE DRAWINGS

FIG. 1 is a schematic illustration of the read portion of a magnetic read-write head.

FIG. 2 shows the layering structure of a first embodiment of the present invention.

FIG. 3 shows the layering structure of a second embodiment of the present invention.

DESCRIPTION OF THE PREFERRED EMBODIMENTS

As discussed above, electrical leads to GMR sensors of the future will need to possess, in addition to the low electrical and high corrosion resistance of the present generation of leads, higher melting points and greater hardness.

The noble and semi-noble metals such as ruthenium, rhodium, palladium, iridium, and platinum were selected as possible candidates because of their high melting points, high corrosion resistance, and hardness. The problem to be solved was how to prepare them with sufficiently low electrical resistivities. Two difficulties needed to be overcome. First, seed and cap layers (below and above the film) were needed. The seed layer was essential as a glue layer as well as to ensure that the metal grew with a crystalline structure that corresponded to a low resistivity phase. The cap layer was used to cap the conductor material and also to serve as a seed layer for deposition of the dielectric passivation layer.

Second, for any given choice of seed and cap layers, it was also important that little or no scattering of conduction electrons take place at the two interfaces (seed-metal and metal-cap) otherwise the sheet resistance of the center layer would be increased and little or no contribution to the total conductance would come from the cap and seed layers.

We were able to find two structures that best satisfied the above conditions. These are presented below as embodiments 1 and 2:

First Embodiment

Referring now to FIG. 2, we show a portion of the sensing head 11 to which is attached the conductor lead 12. The latter is made up of three layers. The first of these is seed layer 21 which is a layer of nickel-chromium alloy. It is between about 40 and 100 Angstroms thick, with 55 Angstroms being preferred. The nickel-chromium alloy contains between about 50 and 60% nickel (atomic) and is deposited by means of DC sputtering or ion beam deposition (IBD).

Above, and directly in contact with, seed layer 21 is ruthenium layer 22. It has a thickness between about 500 and 1,000 Angstroms, with 600 Angstroms being preferred. A key feature of the invention is that, because of the seed layer 21, the ruthenium, which was deposited by means of sputtering or IBD, has a hexagonal close-packed crystal structure. This form of ruthenium in bulk has a resistivity of about 7.7 micro-ohm-cm. which compares to 14.9 micro-ohm-cm. for a thin layer of the material.

Capping layer 22 is layer 23 which is also of nickel-chromium alloy. It is between about 50 and 100 Angstroms thick, with 55 Angstroms being preferred. This nickel-chromium alloy is the same material as the seed layer.

If the structure described above is used, the result is a conductive lead having a sheet resistance between about 1.5 and 1.8 ohms/square (for a 600 Å thick ruthenium layer). The ruthenium lead has a melting point of about 2,300° C. and its hardness is between about 350 and 750 on the Vickers Scale. Additionally, this lead structure has been found to have corrosion resistance comparable to that of a gold lead. We note here that gold has a melting point around 1,064° C. and a Vickers hardness of about 60.

Second Embodiment

Referring now to FIG. 3, we show a portion of the sensing head 11 to which is attached the conductive lead 12. The latter is made up of three layers. The first of these is seed layer 21 which is a layer of nickel-chromium alloy. It is between about 40 and 100 Angstroms thick, with 55 Angstroms being preferred. The nickel-chromium alloy contains between about 50 and 60% nickel (atomic) and is deposited by means of DC sputtering or IBD.

Above, and directly in contact with, seed layer 21 is rhodium layer 32. It has a thickness between about 500 and 1,000 Angstroms, with 500 Angstroms being preferred. A key feature of the invention is that, because of the seed layer 21, the ruthenium, which was deposited by means of DC sputtering or IBD, has a face centered cubic crystal structure. This form of rhodium in bulk has a resistivity of about 4.7 micro-ohm-cm. which compares to 10 micro-ohm-cm. of the thin layer.

Capping layer 32 is layer 23 which is also of nickel-chromium alloy. It is between about 50 and 100 Angstroms thick, with 55 Angstroms being preferred.

If the structure described above is used, the result is a conductor lead having a sheet resistance of about 1.5 to 1.7 ohms/square for a 500Å rhodium layer. The rhodium lead has a melting point of about 1,965° C. and its hardness is between about 120 and 300 on the Vickers Scale. Additionally, this lead structure has been found to have corrosion resistance comparable to that of a gold lead.

The superior properties of the lead structure of the present invention are summarized in TABLE I below (these conductor lead structures were annealed at 280° C. for 5 hours).

TABLE I

Comparison of different lead structures

| Structure | Crystal type | melting point ° C. | resistivity micro-ohm-cm. | Hardness (Vickers) soft | Hardness (Vickers) hard | Corrosion resistance |
|---|---|---|---|---|---|---|
| Ta/Au/Ta | FCC | 1,064 | 5–6 | 25 | 60 | good |
| NiCr/Ru/NiCr | HCP | 2,310 | 9–10 | 350 | 750 | good |
| NiCr/Rh/NiCr | FCC | 1,965 | 8–9 | 120 | 300 | good |

While the invention has been particularly shown and described with reference to the preferred embodiments thereof, it will be understood by those skilled in the art that various changes in form and details may be made without departing from the spirit and scope of the invention.

What is claimed is:

1. A conductor lead having superior electrical and mechanical properties, comprising:
   a first layer of nickel-chromium alloy;
   a layer of ruthenium on said first layer of nickel-chromium; and
   a second layer of nickel-chromium alloy on the layer of ruthenium.

2. The conductor lead described in claim 1 wherein the first and second layers of nickel-chromium alloy each have a thickness between about 40 and 100 Angstroms.

3. The conductor lead described in claim 1 wherein the layer of ruthenium has a thickness between about 500 and 1,000 Angstroms.

4. The conductor lead described in claim 1 wherein said layer of ruthenium has a hexagonal close-packed crystal structure.

5. The conductor lead described in claim 1 wherein said lead has a resistivity between about 9 and 10 micro-ohm-cm.

6. The conductor lead described in claim 1 wherein the first and second layers of nickel-chromium alloy each contain between about 50 and 60 atomic % nickel.

7. The conductor lead described in claim 1 wherein said lead has a melting point of about 2,310° C.

8. The conductor lead described in claim 1 wherein said lead has a hardness value between about 350 and 750 on the Vickers Scale.

9. The conductor lead described in claim 1 wherein said lead has corrosion resistance comparable to that of a gold lead.

10. The conductor lead described in claim 1 further comprising a magneto-resistive sensor element to which said lead is attached.

11. A conductor lead having superior electrical and mechanical properties, comprising:
    a first layer of nickel-chromium alloy;
    a layer of rhodium on said first layer of nickel-chromium; and
    a second layer of nickel-chromium alloy on the layer of ruthenium.

12. The conductor lead described in claim 11 wherein the first and second layers of nickel-chromium alloy each have a thickness between about 40 and 100 Angstroms.

13. The conductor lead described in claim 11 wherein the layer of rhodium has a thickness between about 500 and 1,000 Angstroms.

14. The conductor lead described in claim 11 wherein said layer of rhodium has a face centered cubic crystal structure.

15. The conductor lead described in claim 11 wherein said lead has a resistivity between about 8 and 9 micro-ohm-cm.

16. The conductor lead described in claim 11 wherein the first and second layers of nickel-chromium alloy each contain between about 50 and 60 atomic % nickel.

17. The conductor lead described in claim 11 wherein said lead has a melting point of about 1,965° C.

18. The conductor lead described in claim 11 wherein said lead has a hardness value between about 120 and 300 on the Vickers Scale.

19. The conductor lead described in claim 11 wherein said lead has corrosion resistance comparable to that of a gold lead.

20. The conductor lead described in claim 11 further comprising a magneto-resistive sensor element to which said lead is attached.

* * * * *